(12) United States Patent
Wang et al.

(10) Patent No.: US 11,675,533 B2
(45) Date of Patent: Jun. 13, 2023

(54) ONE-SHOT STATE TRANSITION PROBABILITY ENCODER AND DECODER

(71) Applicant: Seagate Technology LLC, Fremont, CA (US)

(72) Inventors: Zheng Wang, Longmont, CO (US); Marcus Marrow, San Jose, CA (US); Jason Bellorado, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/825,905

(22) Filed: May 26, 2022

(65) Prior Publication Data
US 2022/0286147 A1 Sep. 8, 2022

Related U.S. Application Data

(62) Division of application No. 16/999,250, filed on Aug. 21, 2020, now Pat. No. 11,362,681.

(51) Int. Cl.
| | |
|---|---|
| *H03M 13/29* | (2006.01) |
| *H03M 13/00* | (2006.01) |
| *G06F 3/06* | (2006.01) |
| H03M 13/45 | (2006.01) |
| H03M 13/39 | (2006.01) |
| G06F 18/20 | (2023.01) |

(52) U.S. Cl.
CPC ......... *G06F 3/0656* (2013.01); *G06F 3/0604* (2013.01); *G06F 3/0673* (2013.01); *G06F 18/295* (2023.01); *H03M 13/3961* (2013.01); *H03M 13/45* (2013.01)

(58) Field of Classification Search
CPC .................................................... G06F 3/0656
See application file for complete search history.

(56) References Cited

U.S. PATENT DOCUMENTS

| | | | |
|---|---|---|---|
| 6,043,765 A * | 3/2000 | Twardowski | H03M 7/4081 |
| | | | 341/67 |
| 7,215,265 B2 | 5/2007 | Guionnet et al. | |
| 8,976,474 B1 | 3/2015 | Wang et al. | |
| 9,570,174 B2 | 2/2017 | Dor et al. | |
| 10,574,270 B1 | 2/2020 | Sridhara et al. | |
| 2002/0009134 A1 | 1/2002 | Fischel et al. | |
| 2003/0194012 A1* | 10/2003 | Sakai | H03M 7/425 |
| | | | 375/240.23 |
| 2014/0140400 A1 | 5/2014 | George et al. | |

* cited by examiner

*Primary Examiner* — Joseph D Torres
(74) *Attorney, Agent, or Firm* — Mueting Raasch Group

(57) ABSTRACT

A one-shot state transition decoder receives a codeword having N-bits. The decoder reads a first D-bits of the codeword to determine a stitching location d within the codeword. The stitching location identifies a start bit of unencoded data in the codeword. The codeword is decoded into an output buffer for user data of L bits, where N>L. Parameters of the decoder are set before the decoding, including setting a length of the codeword to N−L+d and a number of expected decoded bits to d. The decoding including decoding the d bits based on a set of state transition probabilities and copying decoded bits into the output buffer, the unencoded data being copied to the end of the output buffer.

14 Claims, 5 Drawing Sheets

ONE-SHOT STATE TRANSITION PROBABILITY ENCODER AND DECODER

RELATED PATENT DOCUMENTS

This application is a divisional of U.S. application Ser. No. 16/999,250 filed on Aug. 21, 2020, which is incorporated herein by reference in its entirety.

SUMMARY

The present disclosure is directed to a one-shot state transition encoder and decoder. In one embodiment, L-bits of user data are received and encoded into a codeword of N-bits, wherein N>L. The encoding of the user data involves repeatedly performing: a) encoding a portion of user bits from the user data to a portion of encoded bits of the codeword based on a set of state transition probabilities, thereby reducing a size of a remaining buffer of the codeword and reducing a number of unencoded bits of the user data; and b) based on the number of unencoded bits of the user data being greater than or equal to the remaining buffer size of the codeword, terminating further encoding and storing the unencoded bits of the user data into the remaining buffer of the codeword.

In another embodiment, an N-bit codeword is received, and a first D-bits of the codeword are read to determine a stitching location d within the codeword. The stitching location identifies a start bit of unencoded data in the codeword. A decoding of the codeword into an output buffer is performed for user data of L-bits, where N>L. Parameters of a decoder are set before the decoding, the setting of parameters including setting a length of the codeword to N−L+d and a number of encoded bits to d. The decoding includes decoding the d encoded bits based on a set of state transition probabilities and copying decoded bits into the output buffer, and copying the unencoded data to the end of the output buffer.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
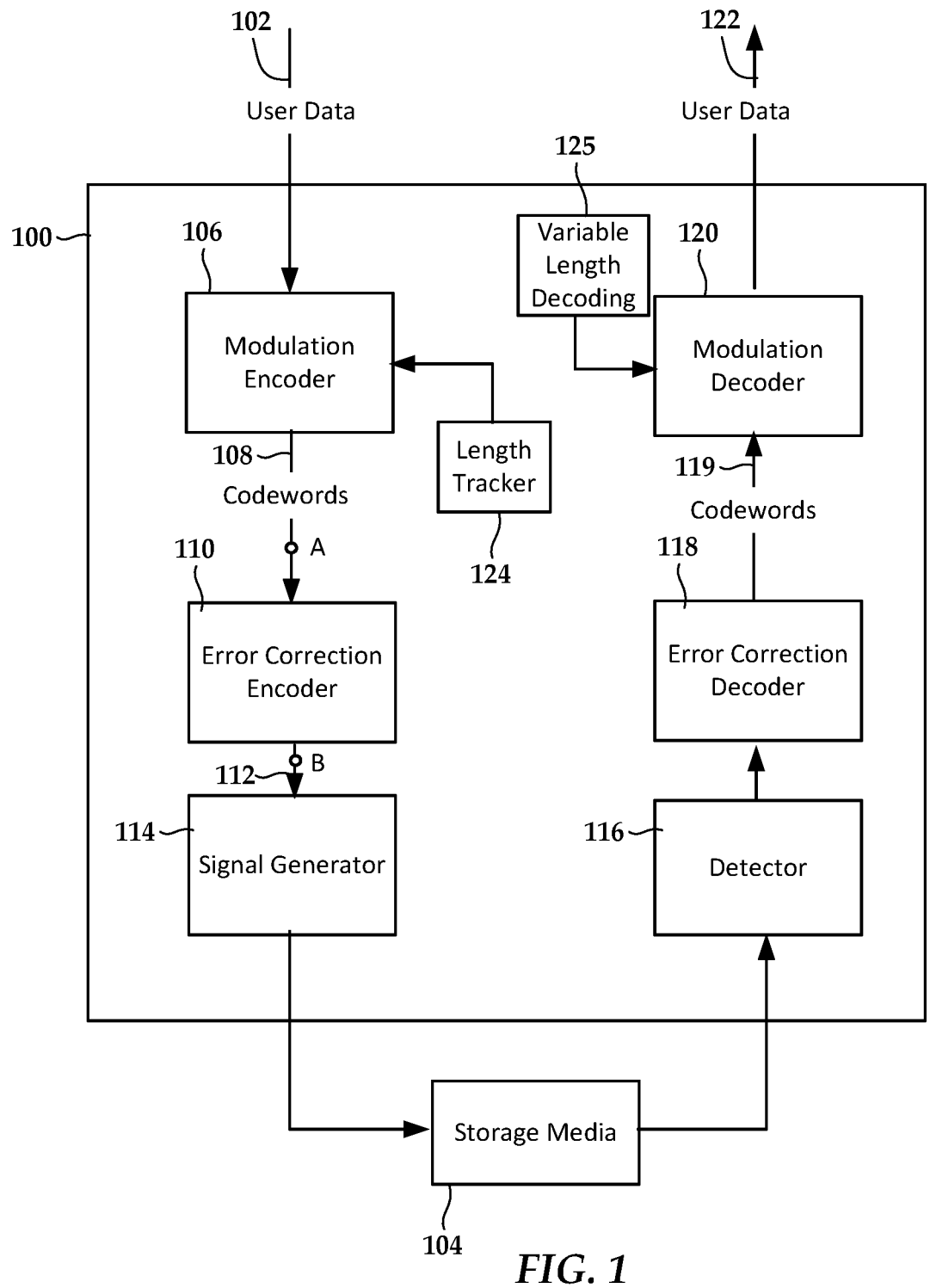
FIG. 1 is a block diagram of an encoding and decoding system according to an example embodiment.

The present disclosure is generally related to encoding and decoding of data to and from a channel. For example, data that is stored on a persistent data storage device such as a hard disk drive (HDD) and solid state drive (SSD), a storage channel facilitates storing and retrieving data to and from a recording medium. For an HDD the recording medium is a magnetic disk and for an SSD the recording medium is a solid state memory cell. While the composition and operation of these types of media may be substantially different, they share characteristics common to many types of communications channels such as noise and loss. Note that while the embodiment below are described as data channels in data storage devices, the concepts may be applicable to other data channels, such as wired and wireless communications.

It is known that certain data patterns or bit sequences are prone to generate errors in the channel. The patterns are particular to the channel and media characteristics, and the patterns may be determined analytically or empirically. To mitigate noise in the channel and reduce resulting read/write errors, a modulation coder is used to ensure that the data transmitted over the channel avoids undesirable patterns. Generally, a modulation encoder takes user data and assembles it into codewords suitable for transmission over the channel and storage onto the medium. Upon subsequent reading of the codeword sequences from the media, the codeword sequences are decoded back to the user data sequence using a complimentary decoder.

Several types of modulation coding schemes may be utilized in the magnetic recording channel of a data storage devices, including run-length limited ("RLL") and running digital sum ("RDS") codes, which limit the number of consecutive ones and zeroes ("1s and 0s") in the codeword sequences. Another modulation coding scheme is known as maximum transition run ("MTR") codes, which limit the number of consecutive transitions allowed in the channel signal. Conventional modulation coding schemes may be implemented in the read/write channel of the HDD device using simple algorithms or lookup tables.

Typically, a storage device will implement only a single modulation coding scheme in the hardware of the device that was designed to impose a fixed set of constraints and cannot be changed or adjusted to account for the individual channel characteristics of a device or class of devices. In addition, conventional modulation coding schemes are capable of generating only deterministic constraints, which are known to be non-optimal for some channel conditions. Analysis has shown that appropriately chosen probabilistic constraints (where different patterns occur with different probabilities) may provide additional signal gain in the magnetic recording channel, for example.

Utilizing the technologies described herein, a universal (programmable) modulation coding mechanism may be implemented in a storage device which utilizes state transition probabilities (e.g., Markov state transition probabilities) to generate either deterministic or probabilistic Markov-constrained codeword sequences. A Markov constraint may be characterized by a finite number of states and the corresponding state transition probabilities. In some embodiments, the universal modulation coding mechanism may implement both deterministic and probabilistic constraints. Probabilistic constraints seek to minimize certain patterns in the generated codeword sequences without eliminating the patterns altogether, as would be the case with deterministic constraints. Details on this encoder are described in U.S. Pat. No. 8,976,474, dated Mar. 10, 2015, which is incorporated herein by reference and referred to below as the "'474 patent."

Due to its probabilistic nature, the state transition probability encoding process has a non-zero probability of failure. The number of encoded bits required to successfully recover the user bits at the decoder varies from codeword to codeword. For a fixed-length mapping coding scheme (which is desired in storage channel, for example) the encoding output buffer size is predetermined. When the required number of encoded bits exceeds the encoding output buffer size, the encoding process fails to converge such that the decoder would not be able to recover the user bits with the generated codeword. The codeword (buffer) size needs to be properly chosen in consideration of the tradeoff between the encoding failure rate and the modulation coding gain.

In order to lower the encoding failure rate without compromising the coding gain, a parallel encoding scheme with multiple encoders were proposed in the '474 patent. In such an arrangement, the multiple scrambled versions of user bit sequence are passed through multiple encoders in parallel. The scrambler generates new user patterns using different seeds in order to create valid codeword for each version. Each encoder may be paired with an encoding checking block to check whether encoding has succeeded. The checking block can be a decoder or a tracking system. If all scramble seeds fail, a pseudo encoding will be applied to the user data. A switch would choose an output among the successful encoders as the final codeword. With N parallel encoders each having encoding failure rate of $p_f$, the overall encoding failure rate of this encoding system is reduced to $p_f^N$. This reduction in encoding failure rate is, however, at the cost of a more complicated system. If all encoders fail to encode, the users bit will go through a pseudo encoding, e.g., copying the unencoded user bits to the encoding output buffer with padding. To achieve this parallelism, more function blocks and buffers need to be added with delicate scheduling.

Embodiments described below utilize a one-shot encoding/decoding scheme that ensures successful encoding with fix-length mapping, which would significantly reduce the complexity of hardware application. The proposed encoder system is shown in the block diagram of FIG. 1. Generally, a processing circuit 100 receives a user data sequence 102 that is received, e.g., from a host computer, and is to be stored on a recording media 104, e.g., a magnetic disk, solid-state memory. The user data sequence may include a sequence of ones and zeros of any size. A modulation encoder 106 converts the user data sequence 102 to a codeword sequence 108 for writing to disk, e.g., one that determines bit sequences using Markov state transition probabilities. The codewords 108 may be of a fixed length, where they can be processed by an error detection encoder 110, e.g. a low-density parity check (LDPC) encoder. In other embodiments described herein, the codewords 108 may be of variable size, and the error detection encoder 110 may output fixed length data 112 that correspond to a storage size compatible with the media 104, e.g., sector size, page size. This data 112 is input to a signal generator 114 where it is converted to a signal appropriate to the recording media 104, such as an analog signal applied to a recording head or a digital signal sent to data register of a flash controller.

Also seen in FIG. 1 is a corresponding read path that includes a detector 116 that detects states of the storage medium 104 (e.g., magnetic transitions, flash cell values) and converts the states to a signal that is input to an error detection decoder 118. The error detection decoder 118 uses decoding that is compatible with the encoding performed by the error correction encoder 110 and outputs codewords 119 that are input to a modulation decoder 120. The modulation decoder 120 uses a decoding scheme that is compatible with the encoding of the modulation encoder 106, and outputs recovered user data 122.

In this example the modulation encoder 106 uses a length tracking block 124 that determines an encoding stop criterion. Generic encoders stop encoding only when the whole encoding output buffer is filled, while the illustrated modulation encoder 106 may stop encoding at any time point before the output buffer is fully filled. The length tracking block 124 calculates a metric on-the-fly, which is used to trigger the early termination in encoding process. If the encoding process is terminated early, the remaining unencoded user bits would be copied to the end of the encoding output buffer. This lets the encoder encode until the system raises a flag signifying a potential encoding failure. The system then stops encoding while keeping the previous encoded bits and stitching them with remaining unencoded user bits. When decoding, a variable length decoding block 125 provides procedures used to extract variable length encoded and unencoded data from recovered codewords 119.

Figure 2:
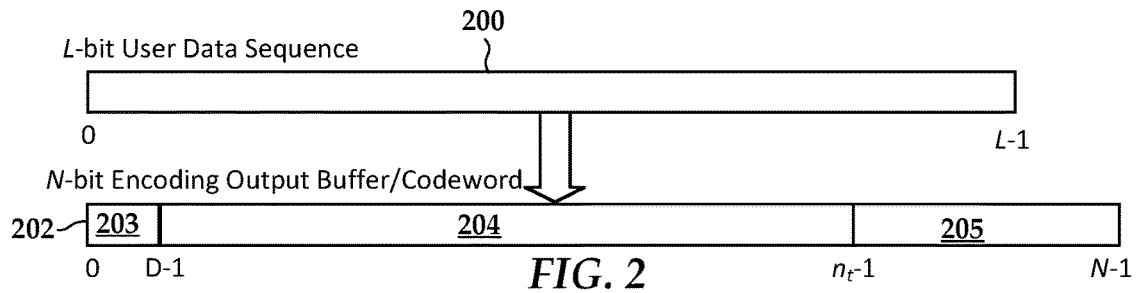
FIG. 2 is a diagram of a user data sequence and codeword buffer according to an example embodiment.

In FIG. 2, a diagram illustrates details of a user data sequence 200 and an output buffer 202 according to an example embodiment. Let L denote the length of user sequence 200, and N the size of the encoding output buffer 202. For purposes of this disclosure, the output buffer 202 may also be referred to herein as the codeword. Note that L and N are system-specific constants defined for the particular encoder and decoder. The output buffer 202 includes 203-205 as shown in FIG. 2. The first section 203 includes D-bits that are reserved to store the stitching location (boundary of the other two sections 204, 205). In this example, D=16 but any number of bits can be used for the size of the first section 203, e.g., D≥$\log_2$ (N−D). The middle section 204 is for storage of the encoded user bits, while the last section 205 is for storage of the unencoded user bits, if any.

Assume that at clock cycle t, the encoder has yielded $n_t$ encoded bits including the initial D bits. Given $n_t$ encoded bits, the decoder can reliably recover $l_t$−2 effective user bits, where $l_t$ is defined by Equation (1) below. Note that the brackets represent the floor function and Pr( ) represents the probability function, the probability being determined by the Markov transition table as described in the '474 patent.

$$l_t = \lfloor -\log_2 Pr(x^{n_t - 16}) \rfloor \qquad (1)$$

Figure 3:
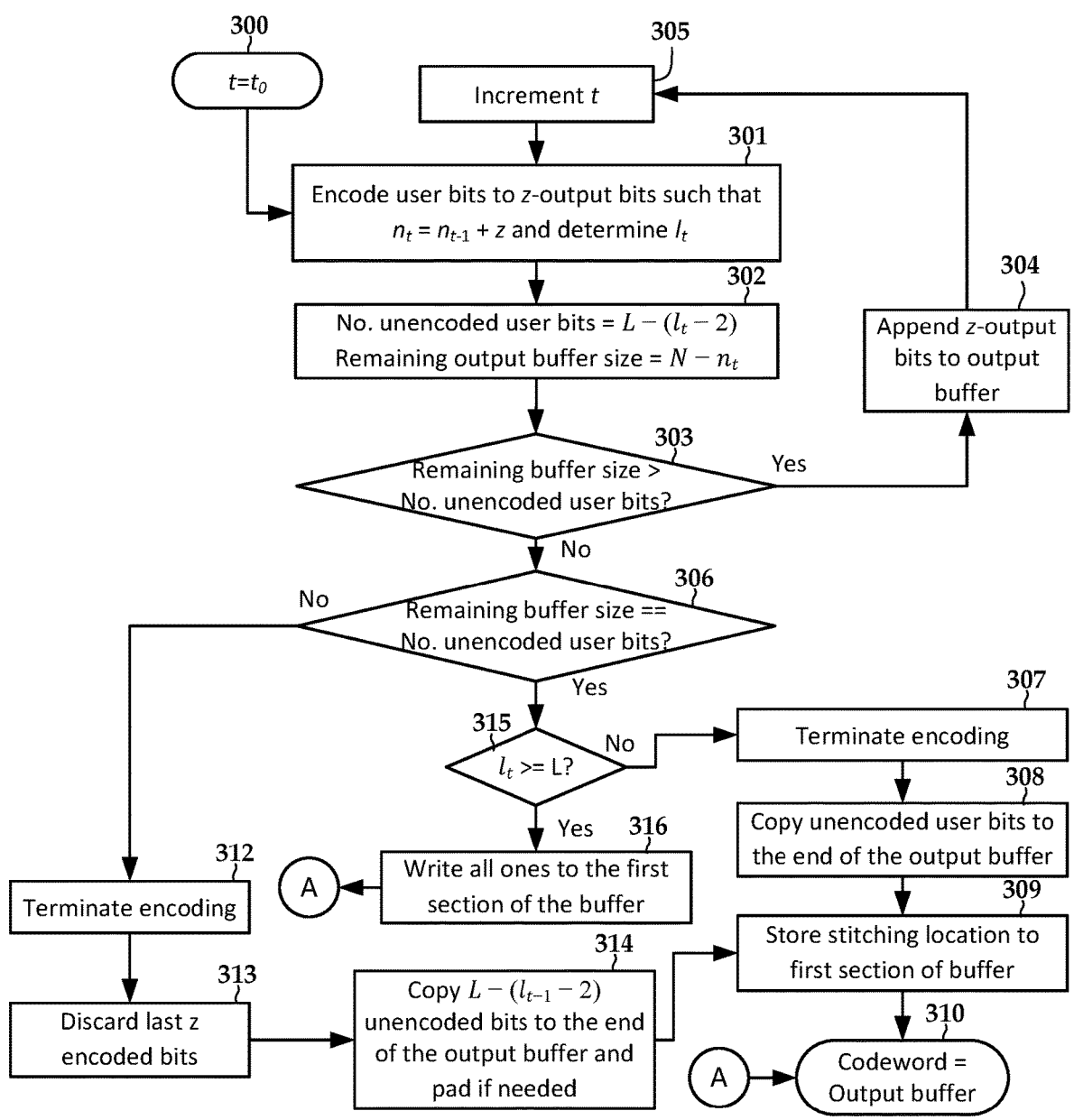
FIGS. 3 and 4 are flowcharts of methods according to an example embodiment.

In FIG. 3, a flowchart shows an encoding procedure according to an example embodiment. The process starts 300 at an initial clock time to. At block 301, some number of user bits are encoded to z-output bits as explained in the '474 patent, where z=4 in one example. The number of encoded bits $n_t = n_{t-1} + z$ can reliably recover $l_t$ user bits, where $l_t$ is found as in Eq. (1). At block 302, a count of unencoded user bits and remaining buffer size in bits are determined. Due to the initial "0" padding and final bit carry operation defined in the '474 patent, two more bits are deducted from $l_t$. Therefore, at block 302 there are L−($l_t$−2) user bits that are not encoded, and the remaining output buffer size is N−$n_t$.

If block 315 returns 'no,' control goes to block 303. At block 303 it is determined if N−$n_t$>L−($l_t$−2), namely whether the remaining output buffer size is larger than the number of bits that are not encoded. If this is true (block 303 returns 'yes'), the encoder appends 304 the encoded bits to the buffer and continues to the next round of encoding where the clock t is incremented at block 305. If block 303 returns 'no,' then block 306 tests if N−$n_t$=L−($l_t$−2), namely whether the remaining output buffer size is equal to the number of bits that are not encoded. If block 306 returns 'yes', then it is determined at block 315 if $l_t$≥, namely whether the L-user bits can be reliably recovered based on the currently encoded $n_t$ bits. If block 315 returns 'no,' then encoding is terminated 307 and the L−($l_r$−2) unencoded user bits are copied 308 to the end of the output buffer. The value of the stitching location, which is $l_r$−2 in this case, is stored 309 in the first section 203 of the output buffer 202. If block 315 returns 'yes,' the whole user bit sequence has been successfully encoded without any stitching. In this case, the first section 203 of the codeword is set 316 to all ones (or some other predetermined pattern indicating there is no stitching), and the method returns at 310 with the output buffer being used as the N-bit codeword.

If block 306 returns 'no,' then N−$n_r$<L−($l_r$−2), and encoding is terminated 312. The most recent z-encoded bits (e.g., 4 bits) are abandoned 313, and the L−($l_{r-1}$−2) unencoded bits are copied 314 to the end of the output buffer 202. If there is a gap between the encoded and unencoded bits, the gap is padded with zeros. The zeros are padded between the encoded bits and uncoded user bits (since both boundaries are known). When the decoder copies uncoded user bits, it counts back from the end of the buffer by certain amount, so the padded zeros will not be copied. The value of stitching location (in this case $l_{r-1}$−2) is stored 309 at the first section 203 of the output buffer 202. The output 310 of this process is the output buffer 202, which holds an N-bit codeword.

Figure 4:
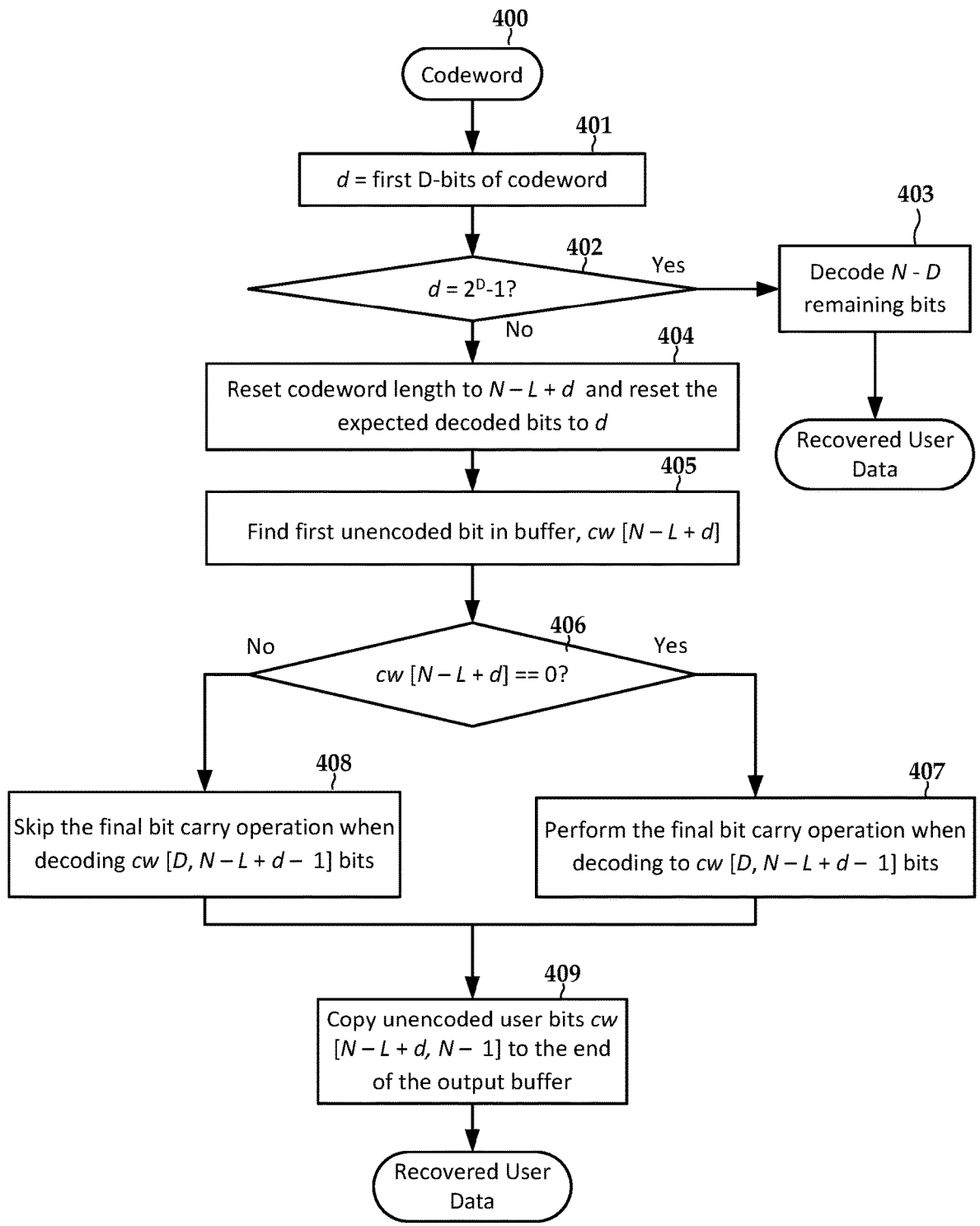

In FIG. 4, a flowchart shows a decoding procedure according to an example embodiment. A codeword is input 400 to the procedure, and a value d is set 401 to the first D-bits of the codeword, which corresponds to the value stored in the first section 203 of the buffer 202. In this example, the buffer 202 would be an input buffer that holds the recovered codeword. If d=$2^D$−1 (block 402 returns 'yes'), the decoder decodes 403 the N−D remaining bits in the codeword as described in the '474 patent. Note that $2^D$−1 is all ones in the first part of the codeword, however some other predetermined pattern may be used, e.g., $2^{D-1}$−1, to indicate there is no stitching in the codeword. If block 402 returns 'no,' the internal parameters of the decoder are reset 404 as follows: the codeword length is reset to N−L+d and the number of expected encoded bits is reset to d. The decoder completes decoding process with the new parameters, but possibly without the "final bit carry" operation defined in the '474 patent.

Let cw denote the decoder input buffer, which would correspond to the buffer 202 shown in FIG. 2. The first unencoded bit in cw, which is cw [N−L+d], is found 405. Based on the value of the first bit, the decoder performs special handling of "final bit carry." Block 406 checks whether cw [N−L+d]=0, and if so perform the final bit carry operation as defined in the '474 patent when decoding 407 the cw [D, N−L+d−1] bits. If block 406 returns 'no,' then cw [N−L+d]=1, and the final bit carry operation is skipped when decoding 408 the cw [D, N−L+d−1] bits. In either case, the unencoded bits cw [N−L+d, N−1] are copied 409 to the end of the decoder output buffer.

When early termination is triggered during the encoding process, the final codeword of the proposed modulation coding system is partially padded with unencoded user bits, which are left unprotected. This unencoded portion of codeword could endure higher noise through the data channel, leading to degradation of overall coding gain in comparison with a more generic coding system. However, the simplicity of the proposed system implies significant reduction in hardware area, power consumption and scheduling complexity. This tradeoff can be taken into consideration for system design with different requirements.

Figure 5:
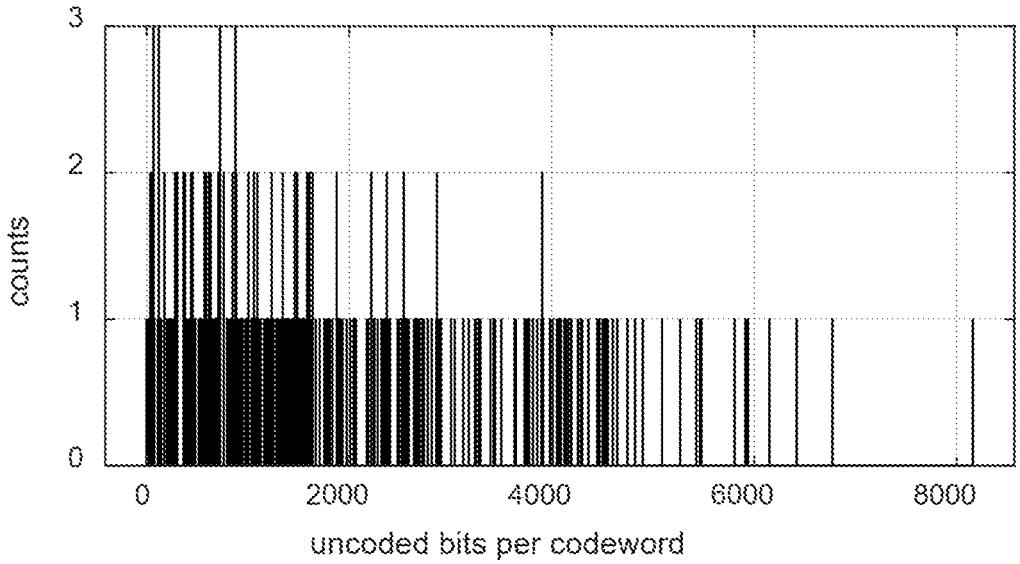
FIGS. 5 and 6 are histograms showing simulation results of an encoder according to example embodiments.
Figure 6:
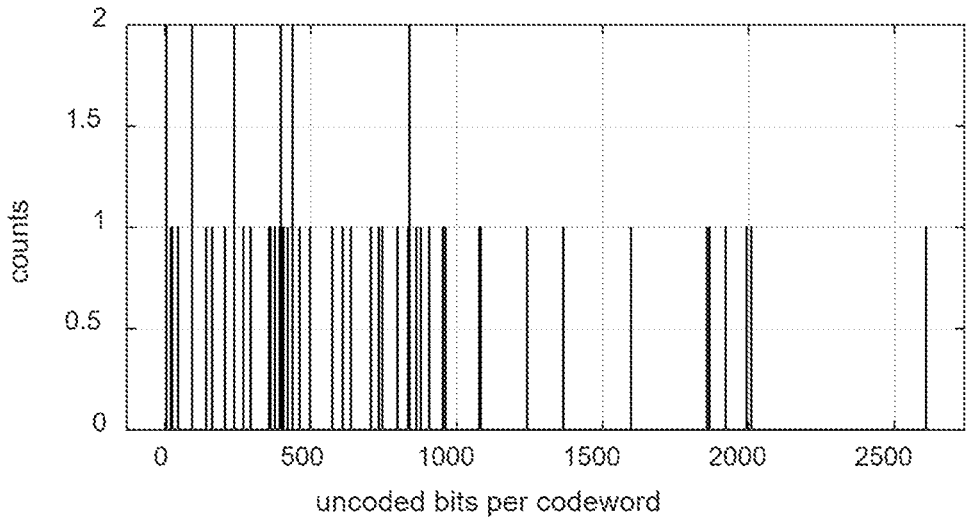

The encoder output buffer size N has an impact on the unencoded user bits distribution. The desired distribution of unencoded user bits should have small mean and small variance, in order to have more protected bits written in the media. This can be approached by increasing encoder output buffer size N, which however would result in format loss. In FIGS. 5 and 6, histograms indicate unencoded bits per codeword with different buffer sizes for a simulation of the encoder described above. The case in FIG. 6 used a slightly larger buffer size than in FIG. 5, which does yields more codewords without padding, and tighter distribution of unencoded bits in the codewords with padding. This tradeoff can also be considered during system design.

In reference again to FIG. 1, an error correction encoder 110 (e.g. LDPC encoder) usually follows the modulation encoder 106 to provide data some extra protection from media corruption. The modulation coding design described above focuses on the modulation coding block 106 itself. An alternate approach is to rely on the flexibility of LDPC encoder 110 to achieve one-shot modulation encoding.

One difficulty of modulation encoder design described above is due to the variable length mapping of the generic algorithm. In other words, for a fixed length user bit sequence fed into the modulation encoder, the codeword length varies depending on the user bit sequence pattern. In data channel, however, a fixed unit (e.g. sector) size is desired (at point B shown in FIG. 1). The parallel encoding scheme in the '474 patent and the one-shot encoding scheme proposed above both aim to yield fixed length output at the modulation encoder 106 (at point A in FIG. 1). The LDPC encoder 110 in this case always expects a fixed input length and yields a fixed output length.

The LDPC encoding is actually capable of adapting to variable input length while maintaining fixed output length by using two techniques. The LDPC encoder can take up to a maximum number of information/input bits, denoted by K. If the user sequence length is less than K, the encoder would fill the remaining input nodes with 0s. This technique is known as zero-filling. The zero-filled bits do not need to be recorded in the final codeword. The other technique, referred as puncturing, intentionally punctures one or multiple parity bits out of the codeword to achieve a desired output length. The locations of the zero-filled and punctured bits need to be available at the LDPC decoder, so that the missing bits are inserted back to the right locations with properly set confidence levels for decoding. These two techniques make it possible to shift the burden of producing fixed length output from point A to point B in FIG. 1.

In this proposed approach, given a user sequence of length L, the modulation encoder keeps operating until enough number of encoded bits are generated to recover the original user sequence. Due to the variable length mapping, the modulation codeword length varies within a range, denoted by [$N_{min}$, $N_{max}$]. The termination of encoding process can be triggered either by a length tracking block or a decoder, as explained in the '474 patent. The modulation codeword is then passed to the LDPC encoder. Let M represent the fixed LDPC codeword length, and P the number of parity bits. The design of LDPC graph needs to satisfy the following conditions:

$$K \geq N_{max}$$

$$P \geq N_{max} - N_{min}$$

$$M \leq N_{min} + P \quad (2)$$

Figure 7:
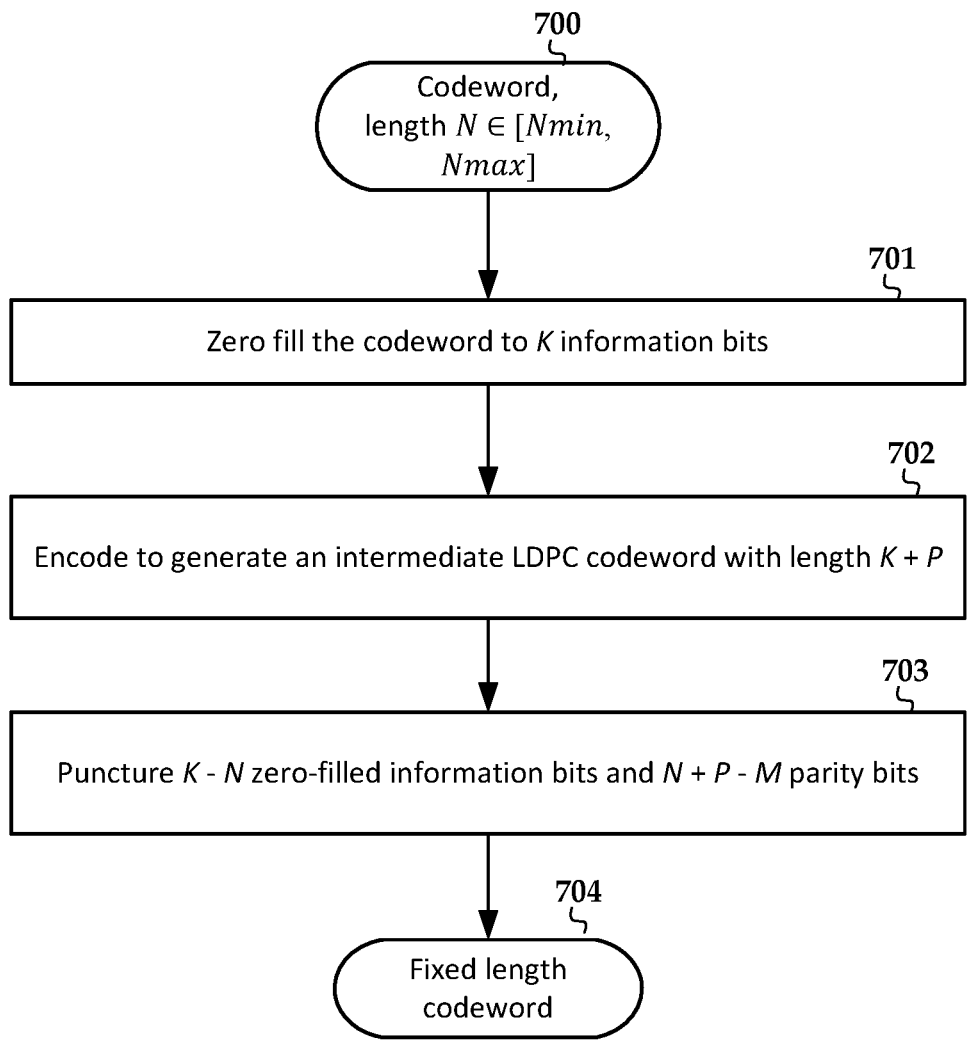
FIG. 7 is a flowchart of a method according to another example embodiment.

The first condition claims that the number of information nodes of the LDPC graph should be no less than the longest modulation codeword. The second condition determines the minimum number of parity bits in the LDPC graph, which depends on the ranges of LDPC input sequence. The third condition sets an upper bound of the LDPC codeword length. In FIG. 7, a flowchart shows an LDPC encoding process according to an example embodiment. The LDPC encoder takes in the modulation codeword 700 of length $N \in [N_{min}, N_{max}]$, and zero-fills it 701 to K information bits, and then performs encoding 702 to generate an intermediate LDPC codeword with length K+P. The K−N zero-filled information bits and N+P−M parity bits will be punctured out 703 of this intermediate codeword to maintain the final output length of M. The overall coding rate for the combined modulation and LDPC block is L/M. With this proposal, the length of the codeword 704 sent to the media (at point B in FIG. 1) remains fixed.

The range of the modulation codeword length $[N_{min}, N_{max}]$ is determined by the modulation code of choice and additional constraints (e.g., DC constraint). A large range value $(N_{max}-N_{min})$ may be a challenge for LDPC graph design, which is out of the scope of this disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method, comprising:
   receiving a signal comprising an N-bit codeword at a processing circuit comprising a modulation decoder;
   reading a first D-bits of the codeword to determine a stitching location d within the codeword, the stitching location identifying a start bit of unencoded data in the codeword;
   performing a decoding of the codeword into an output buffer for user data comprising L bits, L<N, wherein parameters of the modulation decoder are set before the decoding, the setting of the parameters including setting a number of expected decoded bits to d and a length of the codeword to N−L+d, the decoding including decoding the d bits based on a set of state transition probabilities and copying decoded bits into the output buffer;
   copying the unencoded data to an end of the output buffer; and
   sending the output buffer as recovered user data to a host.

2. The method of claim 1, wherein based on the first D-bits being a predetermined pattern, there are no unencoded bits in the codeword and the decoding comprises decoding all N−D bits of the codeword excluding the first D-bits.

3. The method of claim 2, wherein the predetermined pattern is all ones.

4. The method of claim 1, wherein the set of state transition probabilities comprise a set of Markov state transition probabilities used in an encoding of the codeword.

5. The method of claim 4, wherein the encoding implements probabilistic constraints that minimize certain patterns in generated codeword sequences without eliminating the certain patterns.

6. The method of claim 4, wherein the encoding implements deterministic constraints that eliminate certain patterns in generated codeword sequences.

7. The method of claim 1, wherein the codeword is received from a low-density parity check (LDPC) decoder.

8. The method of claim 1, further comprising:
   finding a first unencoded bit of the unencoded data; and
   if the first unencoded bit is equal to a first value, perform a final bit carry operation when decoding the codeword, otherwise do not perform the final bit carry operation if the first unencoded bit is not equal to the first value.

9. An apparatus, comprising a processing circuit, the processing circuit comprising:
   an error correction decoder that decodes an N-bit codeword based on data read from a storage media; and
   a modulation decoder operable to:
   receive a signal comprising the codeword from the storage media;
   read a first D-bits of the codeword to determine a stitching location d within the codeword, the stitching location identifying a start bit of unencoded data in the codeword;
   perform a decoding of the codeword into an output buffer for user data comprising L bits, L<N, wherein parameters of the modulation decoder are set before the decoding, the setting of the parameters including setting a number of expected decoded bits to d and a length of the codeword to N−L+d, the decoding including decoding the d bits based on a set of state transition probabilities and copying decoded bits into the output buffer;
   copy the unencoded data to an end of the output buffer; and
   sending the output buffer as recovered user data to a host.

10. The apparatus of claim 9, wherein based on the first D-bits being a predetermined pattern, there are no unencoded bits in the codeword and the decoding comprises decoding all N−D bits of the codeword excluding the first D-bits.

11. The apparatus of claim 9, wherein the set of state transition probabilities comprise a set of Markov state transition probabilities used in an encoding of the codeword.

12. The apparatus of claim 11, wherein the encoding implements probabilistic constraints that minimizes certain patterns in generated codeword sequences without eliminating the certain patterns.

13. The apparatus of claim 11, wherein the encoding implements deterministic constraints that eliminates certain patterns in generated codeword sequences.

14. The apparatus of claim 9, wherein the error correction decoder comprises a low-density parity check (LDPC) decoder.

\* \* \* \* \*